(12) United States Patent
Zhao et al.

(10) Patent No.: US 12,272,749 B2
(45) Date of Patent: Apr. 8, 2025

(54) LATERALLY DIFFUSED METAL OXIDE SEMICONDUCTOR DEVICE AND METHOD FOR PREPARING THE SAME

(71) Applicant: CSMC TECHNOLOGIES FAB2 CO., LTD., Wuxi (CN)

(72) Inventors: Jingchuan Zhao, Wuxi (CN); Zhili Zhang, Wuxi (CN); Sen Zhang, Wuxi (CN)

(73) Assignee: CSMC TECHNOLOGIES FAB2 CO., LTD., Wuxi (CN)

( * ) Notice: Subject to any disclaimer, the term of this patent is extended or adjusted under 35 U.S.C. 154(b) by 393 days.

(21) Appl. No.: 17/789,628

(22) PCT Filed: Sep. 4, 2020

(86) PCT No.: PCT/CN2020/113361
§ 371 (c)(1),
(2) Date: Jun. 28, 2022

(87) PCT Pub. No.: WO2021/135342
PCT Pub. Date: Jul. 8, 2021

(65) Prior Publication Data
US 2023/0036341 A1 Feb. 2, 2023

(30) Foreign Application Priority Data
Dec. 31, 2019 (CN) .......................... 201911418234.7

(51) Int. Cl.
*H01L 29/78* (2006.01)
*H01L 29/40* (2006.01)
*H01L 29/66* (2006.01)

(52) U.S. Cl.
CPC ........ *H01L 29/7816* (2013.01); *H01L 29/404* (2013.01); *H01L 29/66681* (2013.01); *H01L 29/7835* (2013.01)

(58) Field of Classification Search
CPC ........... H01L 29/0692; H01L 29/42368; H01L 29/66659; H01L 29/407; H01L 29/405;
(Continued)

(56) References Cited

U.S. PATENT DOCUMENTS

| 5,233,215 A * | 8/1993 | Baliga ................... H01L 29/404 257/490 |
| 6,445,019 B2 * | 9/2002 | Van Dalen ............ H01L 29/407 257/E29.328 |

(Continued)

FOREIGN PATENT DOCUMENTS

| CN | 103811546 | 5/2014 |
| CN | 107871778 | 4/2018 |

(Continued)

OTHER PUBLICATIONS

PCT International Search Report and Written Opinion (w/ English translations) for corresponding PCT Application No. PCT/CN2020/113361, mailed Dec. 1, 2020, 10 pages.

(Continued)

*Primary Examiner* — Galina G Yushina
(74) *Attorney, Agent, or Firm* — Dority & Manning, P.A.

(57) ABSTRACT

Disclosed are a laterally diffused metal oxide semiconductor device and a method for preparing the same. The device includes a substrate (101) of a first conductivity type, a drift region (102) of a second conductivity type, a longitudinal floating field plate array and a plurality of implantation regions (103) of the first conductivity type. The drift region is located in the substrate of the first conductivity type. The longitudinal floating field plate array includes a plurality of longitudinal floating field plate structures (104) arranged at intervals in rows and columns. Each longitudinal floating field plate structures includes a dielectric layer (1041) disposed on an inner surface of a trench and a conductive layer (1042) filling the trench. The plurality of implantation (Continued)

regions are located in the drift region of, each implantation region is located between two adjacent longitudinal floating field plate structures in each row.

20 Claims, 6 Drawing Sheets

(58) Field of Classification Search
CPC ............... H01L 29/7816; H01L 29/404; H01L 29/66681; H01L 29/7835; H01L 29/0634
See application file for complete search history.

(56) References Cited

U.S. PATENT DOCUMENTS

| | | | |
|---|---|---|---|
| 7,576,388 B1 | 8/2009 | Wilson et al. | |
| 2003/0049930 A1* | 3/2003 | Disney | ................ H01L 29/7824 257/E29.257 |
| 2005/0082610 A1* | 4/2005 | Shibib | ................ H01L 29/1083 257/E29.268 |
| 2013/0341717 A1 | 12/2013 | Chen et al. | |
| 2017/0263765 A1 | 9/2017 | Kosier et al. | |

FOREIGN PATENT DOCUMENTS

| | | | | |
|---|---|---|---|---|
| CN | 110518056 | | 11/2019 | |
| CN | 110518059 A | * | 11/2019 | ....... H01L 29/66325 |
| JP | 2003528471 A | | 9/2003 | |
| JP | 2011187939 A | | 9/2011 | |
| JP | 2016526804 A | | 9/2016 | |
| JP | 2018530922 A | | 10/2018 | |
| WO | WO2005/065385 A2 | | 7/2005 | |

OTHER PUBLICATIONS

Japanese Office Action for corresponding Application No. 2022-538131, dated Oct. 3, 2023, 2 pages.

Korean Notice of Allowance (w/ English translation) for corresponding Application No. 10-2022-7024644, dated Jun. 27, 2024, 7 pages.

* cited by examiner

LATERALLY DIFFUSED METAL OXIDE SEMICONDUCTOR DEVICE AND METHOD FOR PREPARING THE SAME

RELATED APPLICATION

This application is a national stage application of PCT international application PCT/CN2020/113361, filed on Sep. 4, 2020, which claims priority to Chinese Patent Application No. 201911418234.7, entitled "LATERALLY DIFFUSED METAL OXIDE SEMICONDUCTOR DEVICE AND METHOD FOR PREPARING THE SAME", filed on Dec. 31, 2019, both of which are hereby incorporated by reference in their entireties.

TECHNICAL FIELD

This disclosure relates to the semiconductor technology, in particular to a laterally diffused metal oxide semiconductor device and a method for preparing the same.

BACKGROUND

A field plate is a common structure used in a laterally diffused metal oxide semiconductor (LDMOS) device, to increase a breakdown voltage (BV) and decrease an on-resistance RDS(on) of the device. That is, a longitudinal floating field plate structure is introduced into a drift region, so as to decrease the on-resistance while increasing the withstand voltage of the device. However, due to the fact that a deep trench of the longitudinal floating field plate structure is located in a conductive channel of the device, the drift region may have less conductive paths, i.e., a current path of the device may be blocked during operation, so that the device may still have a high on-resistance. In other words, the on-resistance of the existing lateral diffusion metal oxide semiconductor device may be decreased only to a certain and limited extent by introducing the longitudinal floating field plate structure.

SUMMARY

On this basis, it is desirable to provide a laterally diffused metal oxide semiconductor device with a novel field plate structure and a method for preparing the laterally diffused metal oxide semiconductor device, so as to increase the breakdown voltage while further decreasing the on-resistance of the device.

In order to achieve the above object, the present disclosure provides a laterally diffused metal oxide semiconductor device, including a substrate of a first conductivity type, a drift region of a second conductivity type, a longitudinal floating field plate array and a plurality of implantation regions of the first conductivity type. The drift region of the second conductivity type is located in the substrate of the first conductivity type, and the first conductivity type is opposite to the second conductivity type. The longitudinal floating field plate array includes a plurality of longitudinal floating field plate structures arranged at intervals in rows and columns, the longitudinal floating field plate array has a row direction along a length direction of a conductive channel and a column direction along a width direction of the conductive channel. Each of the plurality of longitudinal floating field plate structures includes a dielectric layer disposed on an inner surface of a trench and a conductive layer filling the trench. The trench penetrates through the drift region of the second conductivity type from a surface of the drift region of the second conductivity type and extends into the substrate of the first conductivity type. The plurality of implantation regions of the first conductivity type are located in the drift region of the second conductivity type, each of the plurality of implantation regions of the first conductivity type is located between two adjacent longitudinal floating field plate structures in each row.

The present disclosure further provides a method for preparing a laterally diffused metal oxide semiconductor device, including:
  providing a substrate of a first conductivity type:
  forming a drift region of a second conductivity type in the substrate of the first conductivity type:
  forming a plurality of implantation regions of the first conductivity type in the drift region of the second conductivity type;
  forming a longitudinal floating field plate array in the drift region of the second conductivity type, the longitudinal floating field plate array including a plurality of longitudinal floating field plate structures arranged at intervals in rows and columns, each of the plurality of longitudinal floating field plate structures including a dielectric layer disposed on an inner surface of a trench and a conductive layer filling the trench; the trench penetrating through the drift region of the second conductivity type from a surface of the drift region of the second conductivity type and extending into the substrate of the first conductivity type; each of the plurality of the implantation regions of the first conductivity type being located between two adjacent longitudinal floating field plate structures in each row.

The details of one or more embodiments of the present disclosure are set forth in the accompanying drawings and description below. Other features, objects and advantages of the present disclosure will become apparent from the description, the drawings and the claims.

BRIEF DESCRIPTION OF THE DRAWINGS

Embodiments and/or examples of the present disclosure may be better described and illustrated by reference to one or more of these drawings. Accompanied details or examples for describing the drawings are not meant to limit the scope of any of the presently described invention, presently described embodiments and/or examples, as well as the best mode of the presently invention as understood.

DETAILED DESCRIPTION

In order to facilitate understanding of the present disclosure, the present disclosure will be described more thoroughly hereinafter with reference to the accompanying drawings. Preferred embodiments of the present disclosure are given in the accompanying drawings. However, the present disclosure may be embodied in many different forms and shall not be limited to the embodiments described herein. On the contrary, the purpose of providing these embodiments is only to make the disclosure more thorough and complete.

Unless otherwise defined, all technical and scientific terminologies used herein have the same meaning as commonly understood by one of ordinary skill in the art. The terminology used in the specification of the present disclosure is for the purpose of describing particular embodiments only and is not intended to limit the present disclosure. As used herein, the term "and/or" includes any and all combinations of one or more of the associated listed items.

Figure 1:
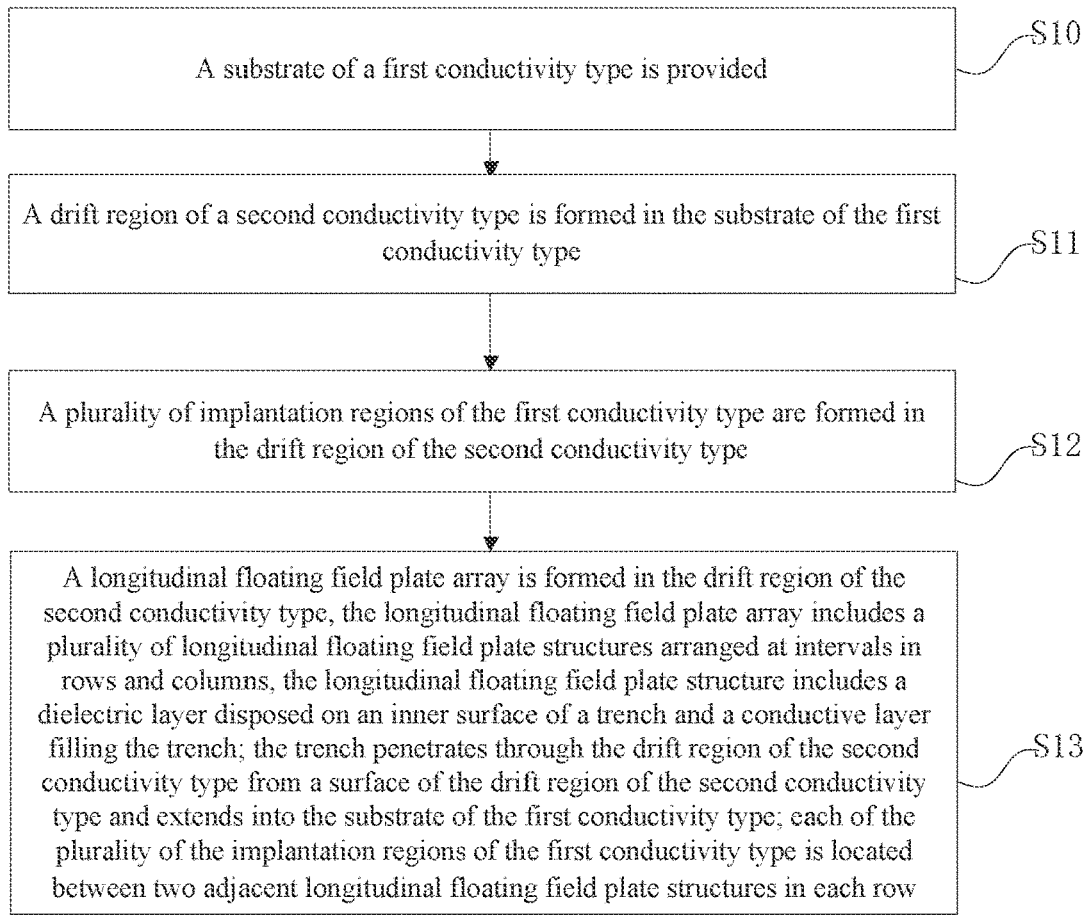
FIG. 1 is a flowchart of a method for preparing a lateral diffusion metal oxide semiconductor device according to an embodiment of the present disclosure.

In one embodiment, referring to FIG. 1, the present disclosure provides a method for preparing a laterally diffused metal oxide semiconductor device, including the following steps.

At a step S10, a substrate of a first conductivity type is provided.

At a step S11, a drift region of a second conductivity type is formed in the substrate of the first conductivity type.

At a step S12, a plurality of implantation regions of the first conductivity type are formed in the drift region of the second conductivity type.

At a step S13, a longitudinal floating field plate array is formed in the drift region of the second conductivity type, the longitudinal floating field plate array includes a plurality of longitudinal floating field plate structures arranged at intervals in rows and columns, the longitudinal floating field plate structure includes a dielectric layer disposed on an inner surface of a trench and a conductive layer filling the trench; the trench penetrates through the drift region of the second conductivity type from a surface of the drift region of the second conductivity type and extends into the substrate of the first conductivity type; each of the plurality of the implantation regions of the first conductivity type is located between two adjacent longitudinal floating field plate structures in each row.

According to the above embodiment, the plurality of longitudinal floating field plate structures penetrate through the drift region of the second conductivity type from the surface of the drift region of the second conductivity type and extend into the substrate of the first conductivity type, so that a surface of the lateral diffusion metal oxide semiconductor device and the substrate of the first conductivity type are equipotential, and a potential of a bottom of each of the plurality of longitudinal floating field plate structures is restricted by the surface, thereby improving the stability of the device. In each of the plurality of longitudinal floating field plate structures, the dielectric layer with a certain thickness is disposed between the conductive layer and the drift region of the second conductivity type as well as the substrate of the first conductivity type, so that doped ions in the drift region of the second conductivity type and charges in the longitudinal floating field plate structure are more easily balanced. A peak of the electric field distribution can be shifted to a bottom of the longitudinal floating field plate structure in the substrate of the first conductivity type from a junction between the substrate of the first conductivity type and the drift region of the second conductivity type, which can effectively prevent the device from breakdown in advance under a reverse withstand voltage. A super junction structure may be formed between two adjacent longitudinal floating field plate structures in each column, due to the formation of the implantation region of the first conductivity type in the drift region of the second conductivity type between two adjacent longitudinal floating field plate structures in each row. The plurality of implantation regions of the first conductivity type may cooperate with the plurality of longitudinal floating field plate structures, which is beneficial for the depletion the device, improving the current capability of the device while increasing the withstand voltage and decreasing the on-resistance of the device. In addition, the conductivity type of the plurality of implantation regions between adjacent longitudinal floating field plate structures is opposite to that of the drift region of the second conductivity type, which is equivalent to adding charges of the first conductivity type in the path where the circuit is not conducting, so that the doping concentration of the drift region of the second conductivity type can be increased, thereby further decreasing the on-resistance of the device.

Figure 2:
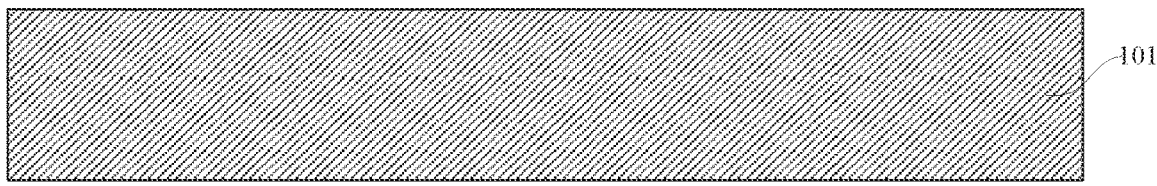
FIG. 2 is a schematic cross-sectional structural diagram of a structure obtained at a step S10 of a method for preparing a lateral diffusion metal oxide semiconductor device according to an embodiment of the present disclosure.

In one example, as shown in FIG. 2, the substrate 101 of the first conductivity type provided in the step S10 includes a high-resistivity substrate, and specifically, the substrate 101 of the first conductivity type may include, but is not limited to, a silicon substrate of the first conductivity type, a gallium nitride substrate of the first conductivity type, or a germanium silicon substrate of the first conductivity type, etc.

Figure 3:
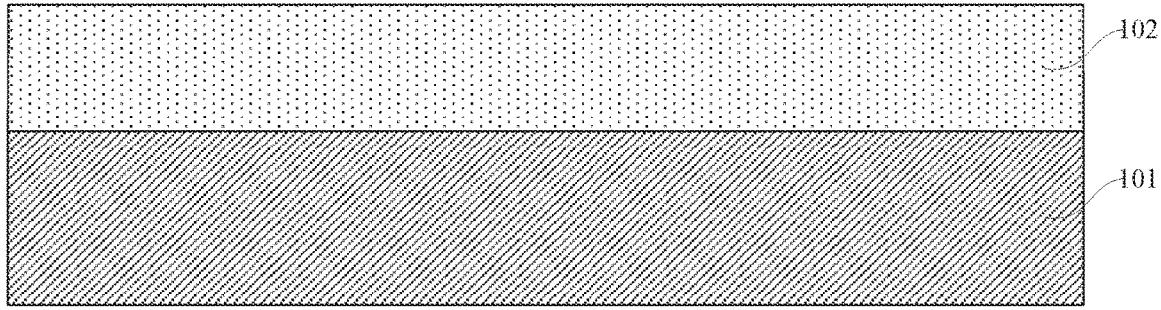
FIG. 3 is a schematic cross-sectional structural diagram of a structure obtained at a step S11 of a method for preparing a lateral diffusion metal oxide semiconductor device according to an embodiment of the present disclosure.

In one example, as shown in FIG. 3, implantation of ions of the second conductivity type may be performed in the substrate 101 of the first conductivity type by using an ion implantation process, such that a partial region of the substrate 101 of the first conductivity type may be reversed to the second conductivity type to serve as the drift region 102 of the second conductivity type. A depth of the drift region 102 of the second conductivity type is less than a thickness of the substrate 101 of the first conductivity type.

Figure 4:
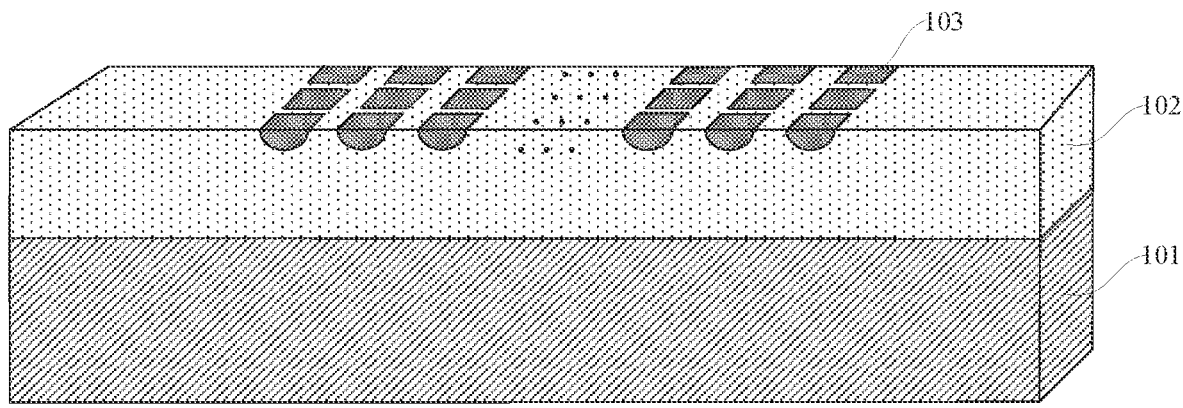
FIG. 4 is a schematic stereoscopic diagram of a structure obtained at a step S12 of a method for preparing a lateral diffusion metal oxide semiconductor device according to an embodiment of the present disclosure.
Figure 5:
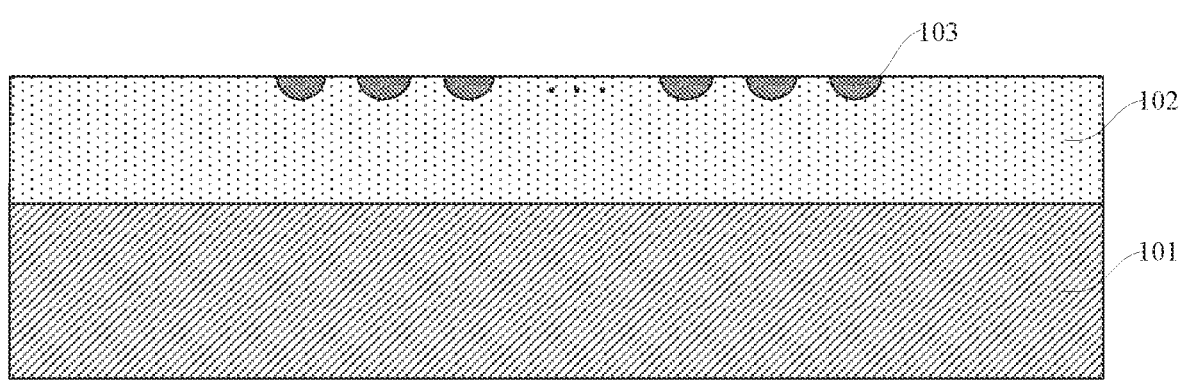
FIG. 5 is a schematic cross-sectional view of FIG. 4.

In one example, as shown in FIG. 4 and FIG. 5, the step S12 may include a following step. That is, implantation of ions of the first conductivity type is performed once in the drift region of the second conductivity type 102, to form the plurality of implantation regions 103 of the first conductivity type in the drift region 102 of the second conductivity type. There are multiple implantation regions 103 of the first conductivity types that are arranged in an array of multiple rows and columns. That is, the plurality of implantation regions 103 of the first conductivity type may be arranged at intervals in rows and columns. Specifically, a column direction of the plurality of implantation regions 103 of the first conductivity type is a width direction of a conductive channel of a subsequently formed device, and a row direction of the plurality of implantation regions 103 of the first conductivity type is a length direction of the conductive channel of the subsequently formed device.

In one example, the plurality of implantation regions 103 of the first conductivity type are arranged at equal intervals. That is, the plurality of implantation regions 103 of the first conductivity type are arranged at equal intervals along the row direction and the column direction.

In one example, a depth of each of the plurality of implantation regions 103 of the first conductivity type is less than a depth of the drift region 102 of the second conductivity type.

Specifically, the step S12 may include the following steps.

At a step S121, a patterned mask layer (not labeled) is formed on a surface of the drift region 102 of the second conductivity type. The patterned mask layer has an opening pattern formed therein, the opening pattern exposes the drift region 102 of the second conductivity type, and defines a shape and position of each implantation region 103 of the first conductivity type.

At a step S122, an ion implantation is performed once in the drift region 102 of the second conductivity type by using the patterned mask layer, and a high temperature junction drive-in process is further performed to form the plurality of implantation regions 103 of the first conductivity type.

At a step S123, the patterned mask layer is removed.

In an optional example, the plurality of implantation regions 103 of the first conductivity type are located in an upper portion of the drift region 102 of the second conductivity type, and a top of each of the plurality of implantation regions 103 of the first conductivity type may be flush with an upper surface of the drift region 102 of the second conductivity type, as shown in FIG. 4 and FIG. 5. Alternately, the top of each of the plurality of implantation regions 103 of the first conductivity type may be spaced apart from the upper surface of the drift region 102 of the second conductivity type.

In another optional example, the plurality of implantation regions 103 of the first conductivity type may be located in a middle portion of the drift region 102 of the second conductivity type.

In yet another optional example, the implanted region 103 of the first conductivity type may be located in a lower portion of the drift region 102 of the second conductivity type, and a bottom of each of the plurality of implantation regions 103 of the first conductivity type is spaced from a lower surface of the drift region 102 of the second conductivity type.

It should be noted that, in the above examples, a depth of each of the plurality of implantation regions 103 of the first conductivity type may be adjusted by ion implantation energy. That is, the deeper the depth of the implantation region 103 of the first conductivity type is, the greater the ion implantation energy is required.

Figure 6:
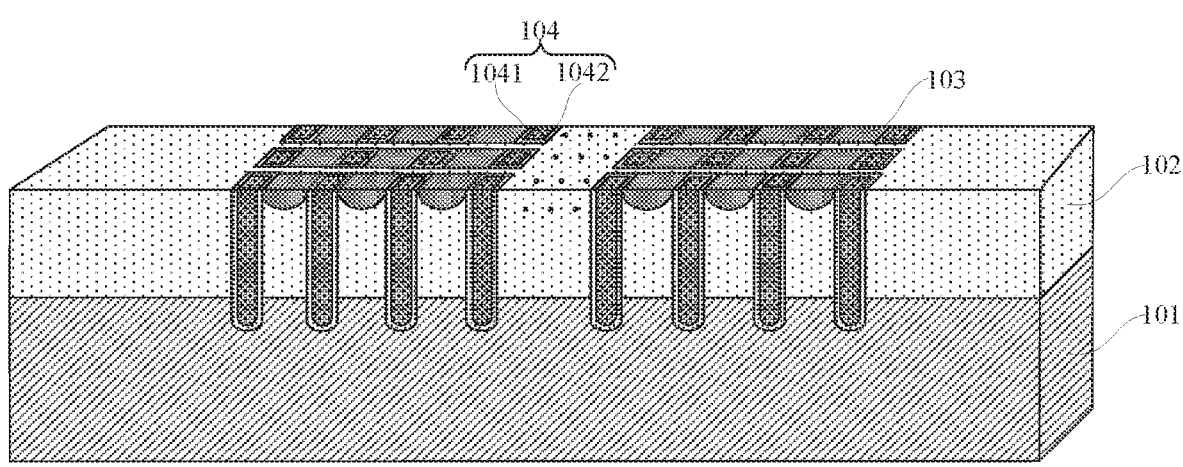
FIG. 6 is a schematic stereoscopic diagram of a structure obtained at a step S13 of a method for preparing a lateral diffusion metal oxide semiconductor device according to an embodiment of the present disclosure.
Figure 7:
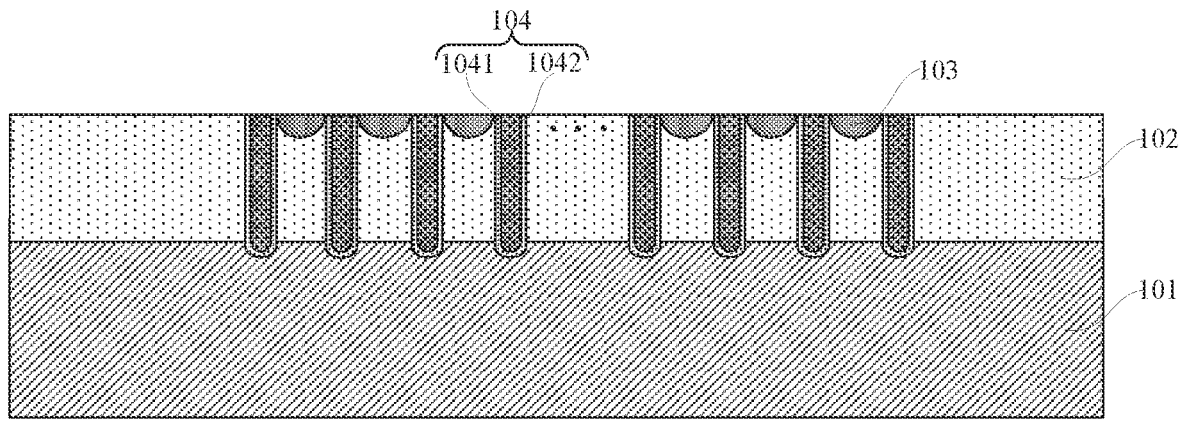
FIG. 7 is a schematic cross-sectional view of FIG. 6.

In one example, as shown in FIG. 6 and FIG. 7, the step S13 may include the following steps.

At a step S131, a plurality of trenches (not labeled) arranged at intervals in multiple rows and columns are formed in the drift region 102 of the second conductivity type, a row direction of the plurality of trenches is a length direction of a subsequently formed conductive channel, and a column direction of the plurality of trenches is a width direction of the subsequently formed conductive channel. Each of the plurality of trenches penetrates through the drift region 102 of the second conductivity type from a surface of the drift region 102 of the second conductivity type, and extends into the substrate 101 of the first conductivity type.

At a step S132, a dielectric layer 1041 is formed on an inner surface (i.e., a sidewall and a bottom) of each of the plurality of trenches.

At a step S133, a conductive layer 1042 is formed on a surface of the dielectric layer 1041 and fills each of the plurality of trenches.

Specifically, in the step S131, the plurality of trenches may be formed by using a photolithography process and an etching process.

Specifically, in the step S132, the dielectric layer 1041 may be formed by using, but not limited to, a thermal oxidation process on an inner surface of each of the plurality of trenches to form an oxide layer (e.g., a silicon oxide layer, etc.), which serves as the dielectric layer 1041. Of course, the dielectric layer 1041 may be formed by using a physical vapor deposition process, a chemical vapor deposition process, or an atomic layer deposition process or the like. The dielectric layer 1041 may be a nitride layer or a nitrogen oxide layer, etc.

Specifically, in the step S133, the conductive layer 1042 may be formed by using a physical vapor deposition process, a chemical vapor deposition process, or an atomic layer deposition process. The conductive layer 1042 may include, but is not limited to, a doped polysilicon layer. The conductive layer 1042 and the dielectric layer 1041 together form a longitudinal floating field plate structure 104.

In one example, the plurality of longitudinal floating field plate structures 104 are formed and configured to be alternately arranged with the implantation region 103 of the first conductivity type along the row direction. A width of each of the plurality of implantation regions 103 of the first conductivity type (i.e., a size of each of the plurality of implantation regions 103 of the first conductivity type along the column direction) is less than or equal to a width of each of the plurality of the floating field plate structures 104 (i.e., a size of each of the plurality of floating field plate structures 104 in the column direction).

In the above example, the width of each of the plurality of implantation regions 103 of the first conductivity type is less than or equal to the width of each of the plurality of floating field plate structures 104, thereby ensuring that the plurality of implantation regions 103 of the first conductivity type would not hinder a flow of electrons w % ben the subsequently formed device is turned on.

In one example, in the longitudinal floating field plate array, the plurality of longitudinal floating field plate structures 104 are arranged at equal intervals along the row direction and the column direction respectively.

In one example, the number of the longitudinal floating field plate structures 104 in each row is equal to the number of columns 104 of the longitudinal floating field plate array, and the number of the longitudinal floating field plate structures 104 in each column is equal to the number of rows of the longitudinal floating field plate array. That is, adjacent floating field plate structures 104 in each row are arranged in a one-to-one correspondence and are not arranged in a staggered manner, and adjacent floating field plate structures 104 in each column are arranged in one-to-one correspondence and are not arranged in a staggered manner as well.

It should be noted that the conductive layer 1042 is configured to penetrate through the drift region 102 of the second conductivity type from the surface of the drift region 102 of the second conductivity type and extend into the substrate 101 of the first conductivity type, so that a surface of an eventually formed device and the substrate 101 of the first conductivity type are equal in potential, thereby improving the stability of the device.

It should be further noted that, in other examples, the step S12 may be exchanged with the step S13. That is, in other examples, the longitudinal floating field plate array formed in the drift region 102 of the second conductivity type may be performed prior to the formation of the plurality of implantation regions 103 of the first conductivity type formed in the drift region 102 of the second conductivity type.

It should be further noted that the term "floating" in the longitudinal floating field plate structure 104 indicates that the longitudinal floating field plate structure 104 is not connected to external voltage.

In an optional example, as shown in FIG. 8 to FIG. 11, the method further includes the following steps after the step S13.

Figure 8:
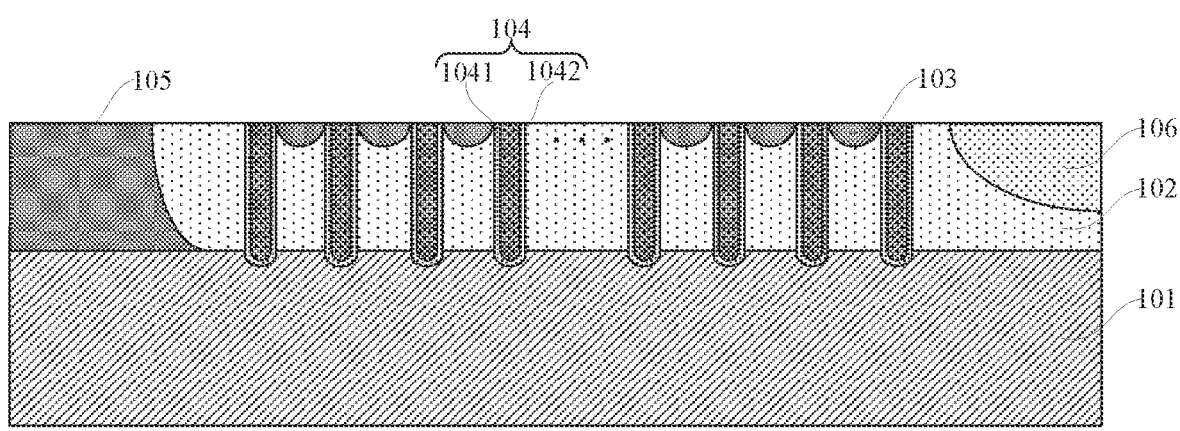
FIG. 8 is a schematic cross-sectional structural diagram of a structure obtained at a step S14 of a method for preparing a lateral diffusion metal oxide semiconductor device according to an embodiment of the present disclosure.

At a step S14, a well region 105 of the first conductivity type is formed at a side of the drift region 102 of the second conductivity type, and a well region 106 of the second conductivity type is formed in the drift region 102 of the second conductivity type. The well region 106 of the second conductivity type is located at a side of the longitudinal floating field plate array away from the well region 105 of the first conductivity type, and is spaced apart from the longitudinal floating field plate array, as shown in FIG. 8. The well region 106 of the second conductivity type serves as a buffer of the drift region for a drain region 111, which can increase an on-state breakdown voltage of the LDMOS device during a forward operation. The well region 105 of the first conductivity type serves as a region for forming the conductive channel of the device, and the concentration of the well region 105 of the first conductivity type can affect the depletion and an on-state voltage drop of the drift region 102 of the second conductivity type.

Figure 9:
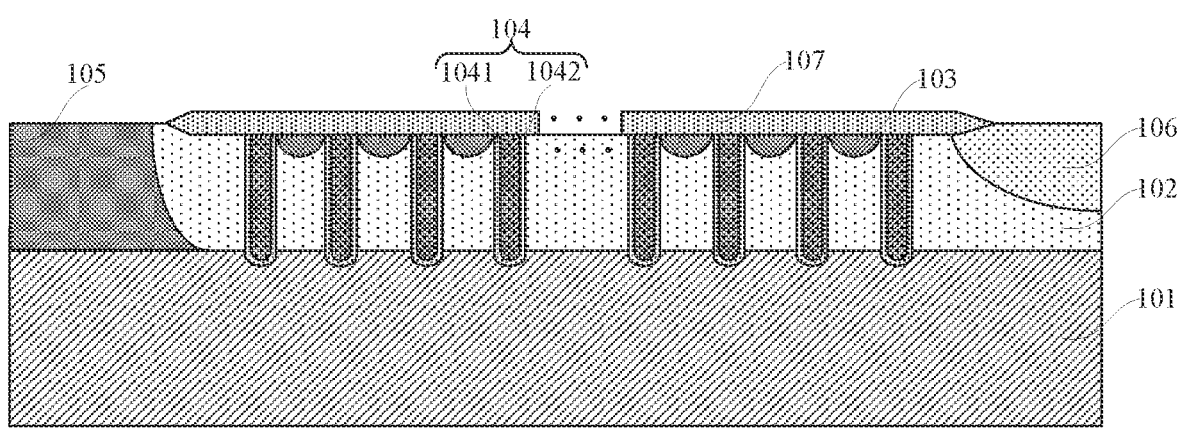
FIG. 9 is a schematic cross-sectional structural diagram of a structure obtained at a step S15 of a method for preparing a lateral diffusion metal oxide semiconductor device according to an embodiment of the present disclosure.

At a step S15, a field oxide layer 107 is formed on the drift region 102 of the second conductivity type, and the field oxide layer 107 is configured to cover the longitudinal floating field plate array, as shown in FIG. 9.

Figure 10:
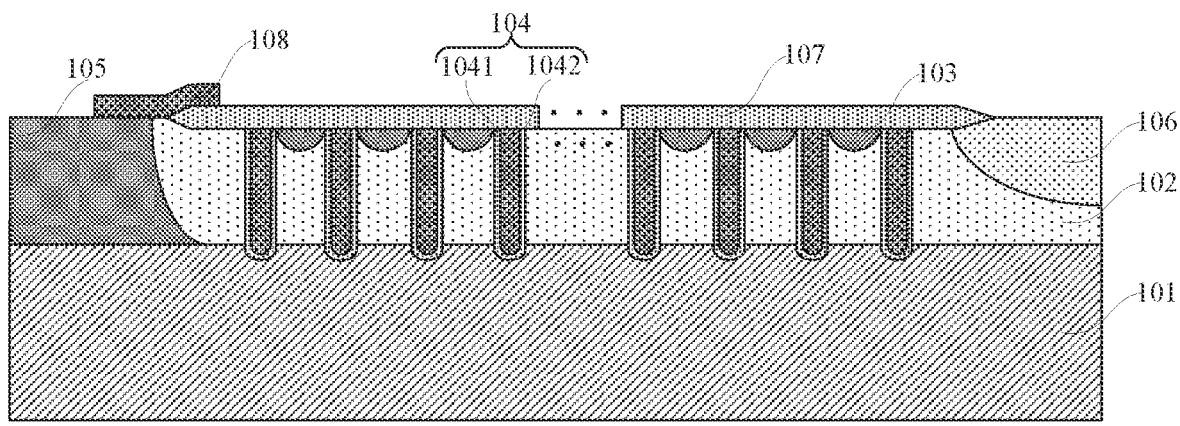
FIG. 10 is a schematic cross-sectional structural diagram of a structure obtained at a step S16 of a method for preparing a lateral diffusion metal oxide semiconductor device according to an embodiment of the present disclosure.

At a step S16, a gate 108 is formed on the well region 105 of the first conductivity type and on the field oxide layer 107, and the gate electrode 108 extends from the well region 105 of the first conductivity type to a surface of the field oxide layer 107, as shown in FIG. 10.

Figure 11:
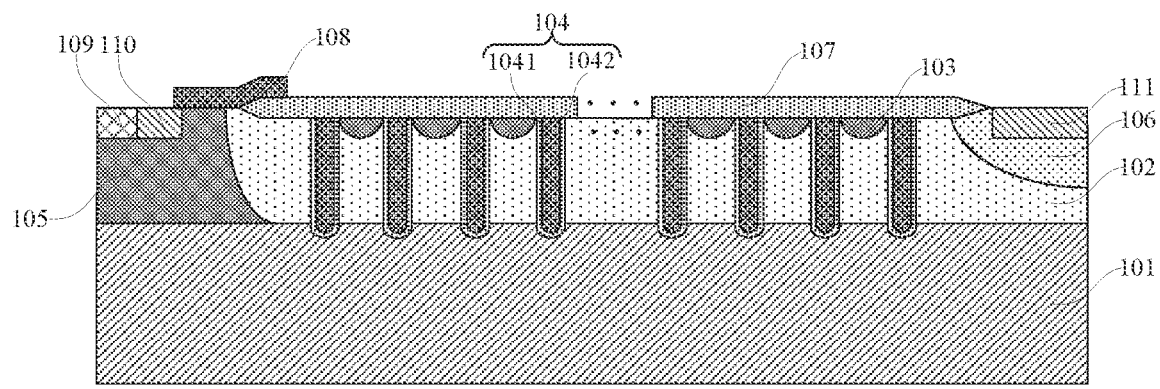
FIG. 11 is a schematic cross-sectional structural diagram of a structure obtained at a step S17 of a method for preparing a lateral diffusion metal oxide semiconductor device according to an embodiment of the present disclosure.

At a step S17, a source region 110 as well as a body region 109 of the first conductivity type (i.e., a lead-out region of the substrate 101 of the first conductivity type) are formed in the well region 105 of the first conductivity type, and a drain region 111 is formed in the well region 106 of the second conductivity type. The source region 110 is spaced apart from the drift region 102 of the second conductivity type, and the body region 109 of the first conductivity type is located at a side of the source region 110 away from the longitudinal floating field plate array and is in contact with the source region 110, as shown in FIG. 11.

At a step S18, a plurality of interconnection holes (not labelled) are formed in the field oxide layer 107, and the plurality of interconnection holes are in one-to-one correspondence with the plurality of longitudinal floating field plate structures 104 and expose the conductive layer 1042 of each of the plurality of longitudinal floating field plate structures 104.

At a step S19, a conductive structure 113 is formed in each of the plurality of interconnection holes.

Figure 12:
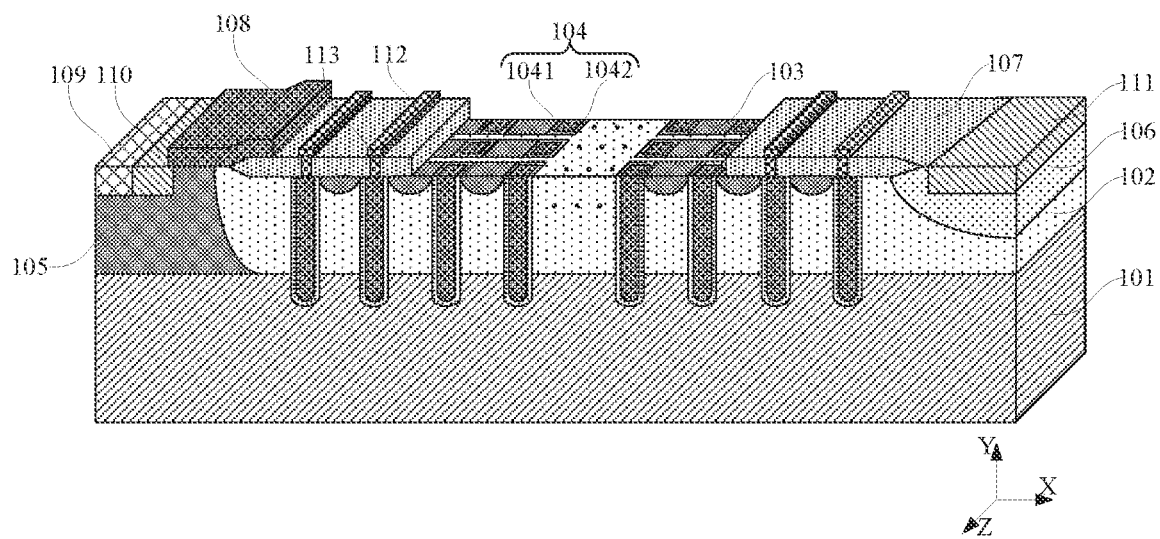
FIG. 12 is a schematic stereoscopic diagram of a structure obtained at a step S18 of a method for preparing a lateral diffusion metal oxide semiconductor device according to an embodiment of the present disclosure.
Figure 13:
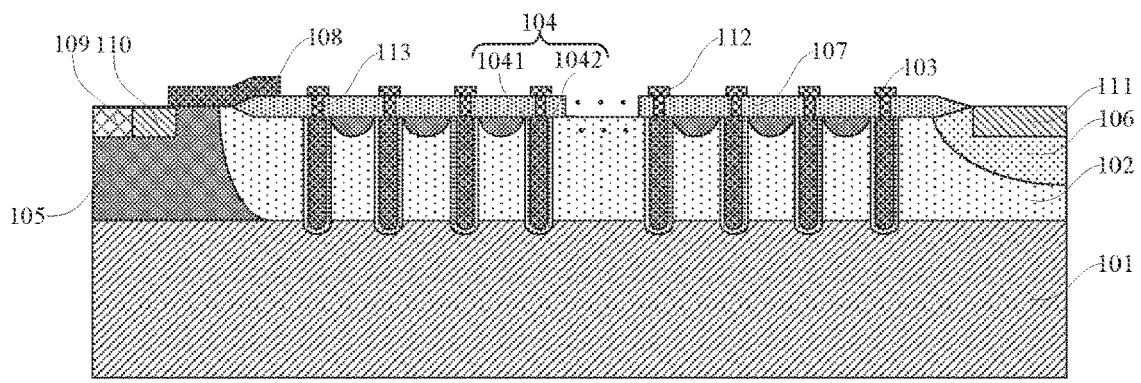
FIG. 13 is a schematic cross-sectional view of FIG. 12.

At a step S20, a plurality of conductive equipotential strips 112 are formed on the field oxide layer 107, and each of the plurality of conductive equipotential strips 112 extends along the width direction of the conductive channel, and is electrically connected to, via the conductive structure 113, a column of the longitudinal floating field plate structures correspondingly located below the field oxide layer, as shown in FIG. 12 and FIG. 13.

Specifically, in the step S14, the well region 105 of the first conductivity type and the well region 106 of the second conductivity type may be formed by an ion implantation process. A depth of the well region 105 of the first conductivity type may be equal to a depth of the drift region 102 of the second conductivity type, and a depth of the well region 106 of the second conductivity type is less than the depth of the drift region 102 of the second conductivity type.

Specifically, in the step S15, the field oxide layer 107 may be formed by using, but is not limited to, a thermal oxidation process.

Specifically, the gate 108 formed in the step S16 may include, but is not limited to, a polysilicon gate, and specifically, the gate 108 may include a doped polysilicon gate.

Specifically, in the step S17, an ion implantation process may be used to form the source region 110, the drain region 111 and the body region 109. The body region 109 is a region of the first conductivity type, the source region 110 is a region of the second conductivity type, and the drain region 111 is a region of the second conductivity type. More specifically, the body region 109, the source region 110 and the drain region 111 are all heavily doped regions. The substrate 101 of the first conductivity type, the drift region 102 of the second conductivity type, the implantation region 103 of the first conductivity type, the well region 105 of the first conductivity type, and the well region 106 of the second conductivity type are all lightly doped regions. The so-called "heavily doped region" refers to a region where the doping concentration is greater than or equal to $1 \times 10^{18}$ atom/cm$^3$, and the so-called "lightly doped region" refers to a region having a doping concentration of less than or equal to $1 \times 10^{18}$ atom/cm$^3$.

It should be noted that, as shown in FIG. 12, in the above examples, the row direction is the X direction shown in FIG. 12, the column direction is the Z direction shown in FIG. 12. That is, the X direction is the length direction of the conductive channel of the device, the Z direction is the width direction of the conductive channel of the device, and the Y direction is a vertical direction of the device. FIG. 13 is a cross-sectional structure diagram of FIG. 12 along the Y direction.

In one example, a material of the conductive equipotential strip 112 and the conductive structure 113 may be metal, and specifically, may be aluminum, copper, gold or nickel, etc.

In one example, the plurality of conductive equipotential strips arranged in columns are at equal intervals. That is, the plurality of conductive equipotential strips 112 are at equal intervals in the column direction, so that two adjacent longitudinal floating field plate structures 104 may have equal capacitance.

Figure 14:
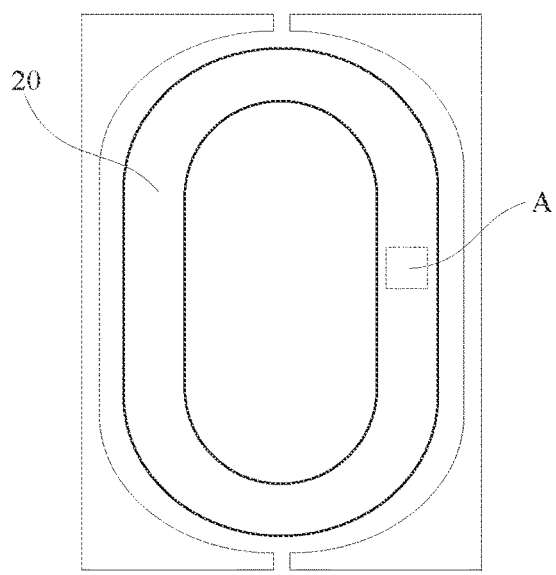
FIG. 14 is a top view of a schematic structure obtained at steps S18 to S20 of a method for preparing a lateral diffusion metal oxide semiconductor device according to an embodiment of the present disclosure.

In one example, the plurality of conductive equipotential strips further constitute equipotential rings defining a racetrack shaped structure in a layout. As shown in FIG. 14, the plurality of conductive equipotential strips 112, the plurality of implantation region 103 of the first conductivity type and the plurality of longitudinal floating field plate structures 104 are located in the racetrack shaped region 20.

Figure 15:
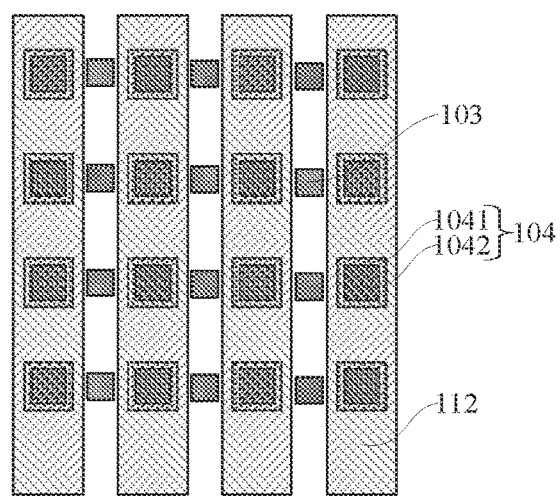
FIG. 15 is an enlarged view of a region A in FIG. 14.

In one example, as shown in FIG. 15, the plurality of longitudinal floating field plate structures 104 are arranged side by side.

Figure 16:
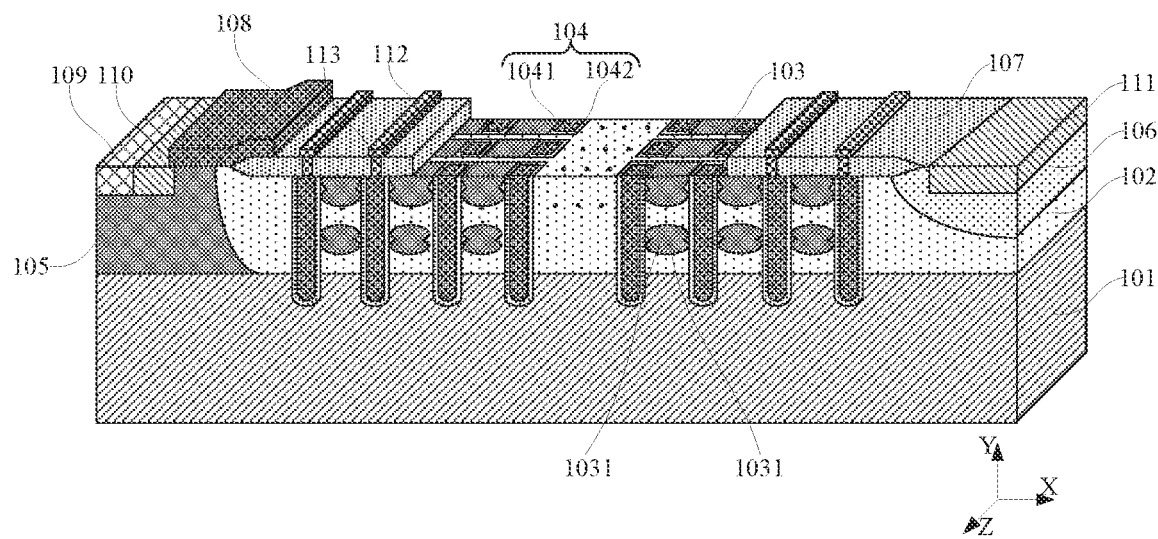
FIG. 16 is a schematic stereoscopic diagram of a structure obtained by a method for preparing a lateral diffusion metal oxide semiconductor device according to another embodiment of the present disclosure.
Figure 17:
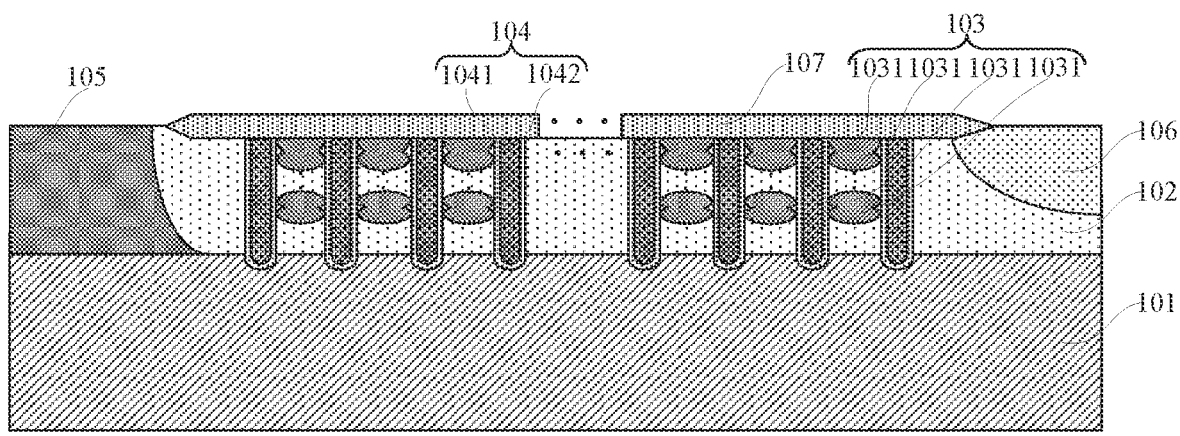
FIG. 17 is a schematic cross-sectional view of FIG. 16.

In another embodiment, referring to FIG. 16 to FIG. 17 and in combination with FIG. 1 to FIG. 15, the present disclosure further provides a method for preparing a laterally diffused metal oxide semiconductor device. The method for preparing the laterally diffused metal oxide semiconductor device in this embodiment is substantially the same as that as shown in FIG. 1 to FIG. 15 in the above embodiments, and the difference therebetween may lie in the step S12. In the method for preparing the laterally diffused metal oxide semiconductor device as shown in FIG. 1 to FIG. 15, the implantation of ions of the first conductivity type is performed once in the drift region 102 of the second conductivity type, and the depth of the implantation region 103 of the formed first conductivity type is decreased. However, in this embodiment, multiple implantations of ions of the first conductivity type are performed in the drift region 102 of the second conductivity type, to form the plurality of implantation regions 103 of the first conductivity type in the drift region of the second conductivity type, and each of the plurality of implantation regions 103 of the first conductivity type includes a plurality of sub-implantation regions 1031 of the first conductivity type arranged along the depth direction of the drift region 102 of the second conductivity type. In this embodiment, the plurality of sub-implantation regions of the first conductivity type are formed by performing multiple sub-implantation processes, which is beneficial for better depletion of the drift region 102 of the second conductivity type. As compared to the solution as shown in FIG. 1 to FIG. 15, the performance of the device may be further improved. In one example, a depth of each of the plurality of implantation regions 103 of the first conductivity type may be also less than a depth of the drift region 102 of the second conductivity type.

In one example, the plurality of sub-implantation regions 1031 of the first conductivity type arranged along the depth direction of the drift region 102 of the second conductivity type may be sequentially connected in series, or may be arranged at intervals.

In the above methods for preparing the lateral diffusion metal oxide semiconductor device, in one example, the first conductivity type may be P-type, and the second conductivity type may be N-type. In another example, the first conductivity type may be N-type, and the second conductivity type may be P-type.

In yet another embodiment, referring to FIG. 12 to FIG. 15, the present disclosure further provides a laterally diffused metal oxide semiconductor device, including a substrate 101 of a first conductivity type, a drift region 102 of a second conductivity type, a longitudinal floating field plate array and a plurality of implantation regions 103 of the first conductivity type. The drift region 102 of the second conductivity type is located in the substrate 101 of the first conductivity type, and the first conductivity type is opposite to the second conductivity type. The longitudinal floating field plate array includes a plurality of longitudinal floating field plate structures 104 arranged at intervals in rows and columns, a row direction of the plurality of longitudinal floating field plate structures 104 is along a length direction of a conductive channel, and a column direction of the plurality of longitudinal floating field plate structures 104 is along a width direction of the conductive channel. Each of the plurality of longitudinal floating field plate structures 104 includes a dielectric layer 1041 disposed on an inner surface of a trench (not labeled) and a conductive layer 1042 filling the trench, and the trench penetrates through the drift region 102 of the second conductivity type from a surface of the drift region 102 of the second conductivity type, and extends into the substrate 101 of the first conductivity type. The plurality of implantation regions 103 of the first conductivity type are located in the drift region 102 of the second conductivity type, each of the plurality of the implantation regions of the first conductivity type is located between two adjacent longitudinal floating field plate structures in each row.

According to the above embodiment, the plurality of longitudinal floating field plate structures 104 penetrate through the drift region 102 of the second conductivity type from the surface of the drift region 102 of the second conductivity type and extend into the substrate 101 of the first conductivity type, so that a surface of the lateral diffusion metal oxide semiconductor device and the substrate of the first conductivity type 101 are equipotential, and a potential of a bottom of each of the plurality of longitudinal floating field plate structures 104 is restricted by the surface, thereby improving the stability of the device. In each of the plurality of the longitudinal floating field plate structures 104, the dielectric layer 1041 with a certain thickness is disposed between the conductive layer 1042 and the drift region 102 of the second conductivity type as well as the substrate 101 of the first conductivity type, so that doped ions in the drift region 102 of the second conductivity type and charges in the longitudinal floating field plate structure 104 are more easily balanced. A peak of the electric field distribution can be shifted to a bottom of the longitudinal floating field plate structure 104 in the substrate 101 of the first conductivity type from a junction between the substrate 101 of the first conductivity type and the drift region 102 of the second conductivity type, which can effectively prevent the device from breakdown in advance under a reverse withstand voltage. A super junction structure may be formed between two adjacent longitudinal floating field plate structures 104 in each column, due to the formation of the implantation region 103 of the first conductivity type in the drift region 102 of the second conductivity type between two adjacent longitudinal floating field plate structures 104 in each row. The plurality of implantation regions 103 of the first conductivity type may cooperate with the plurality of longitudinal floating field plate structures 104, which is beneficial for the depletion the device, improving the current capability of the device while increasing the withstand voltage and decreasing the on-resistance of the device. In addition, the conductivity type of the plurality of implantation regions 103 between adjacent longitudinal floating field plate structures 104 is opposite to that of the drift region 102 of the second conductivity type, which is equivalent to adding charges of the first conductivity type in the path where the circuit is not conducting, so that the doping concentration of the drift region 102 of the second conductivity type can be increased, thereby further decreasing the on-resistance of the device.

It should be noted that, as shown in FIG. 12, in this embodiment, the row direction is the X direction shown in FIG. 12, the column direction is the Z direction shown in FIG. 12. That is, the X direction is the length direction of the conductive channel of the device, the Z direction is the width direction of the conductive channel of the device, and the Y direction is a vertical direction of the device. FIG. 13 is a cross-sectional structure diagram of FIG. 12 along the Y direction.

In one example, the substrate 101 of the first conductivity type includes a high-resistivity substrate, and specifically, the substrate 101 of the first conductivity type may include, but is not limited to, a silicon substrate of the first conductivity type, a gallium nitride substrate of the first conductivity type, or a germanium silicon substrate of the first conductivity type, etc.

In one example, a depth of the drift region 102 of the second conductivity type is less than a thickness of the substrate 101 of the first conductivity type.

In one example, the plurality of implantation regions 103 of the first conductivity type are arranged at equal intervals. That is, the plurality of implantation regions 103 of the first conductivity type are arranged at equal intervals along the row direction and the column direction.

In one example, a depth of each of the plurality of implantation regions 103 of the first conductivity type is less than a depth of the drift region 102 of the second conductivity type.

In an optional example, the plurality of implantation regions 103 of the first conductivity type are located in an upper portion of the drift region 102 of the second conductivity type, and a top of each of the plurality of implantation regions 103 of the first conductivity type may be flush with an upper surface of the drift region 102 of the second conductivity type, as shown in FIGS. 12 and 13. Alternately, the top of each of the plurality of implantation regions 103 of the first conductivity type may be spaced apart from the upper surface of the drift region 102 of the second conductivity type.

In another optional example, the plurality of implantation regions 103 of the first conductivity type may be located in a middle portion of the drift region 102 of the second conductivity type.

In yet another optional example, the plurality of implantation regions 103 of the first conductivity type may be located in a lower portion of the drift region 102 of the second conductivity type, and a bottom of each of the plurality of implantation regions 103 of the first conductivity type may be spaced apart from a lower surface of the drift region 102 of the second conductivity type.

It should be noted that, in the above examples, a depth of each of the plurality of implantation regions 103 of the first conductivity type may be adjusted by ion implantation energy. That is, the deeper the depth of the implantation region 103 of the first conductivity type is, the greater the ion implantation energy is required.

In one example, the dielectric layer 1041 may include, but is not limited to, an oxide layer, such as a silicon oxide layer and the like. In other examples, the dielectric layer 1041 may also include a nitride layer or a nitrogen oxide layer.

In one example, the conductive layer 1042 may include, but is not limited to, a doped polysilicon layer.

In one example, the plurality of longitudinal floating field plate structures 104 are alternately arranged with the plurality of implantation regions 103 of the first conductivity type along the row direction. The width of each of the plurality of implantation regions 103 of the first conductivity type (i.e., a size of each of the plurality of implantation regions 103 of the first conductivity type along the column direction) is less than or equal to a width of each of the plurality of the floating field plate structures 104 (i.e., a size of each of the plurality of floating field plate structures 104 in the column direction).

In the above example, the width of each of the plurality of implantation regions 103 of the first conductivity type is less than or equal to the width of each of the plurality of floating field plate structures 104, thereby ensuring that the plurality of implantation regions 103 of the first conductivity type would not hinder a flow of electrons when a subsequently formed device is turned on.

In one example, in the longitudinal floating field plate array, the plurality of longitudinal floating field plate structures 104 are arranged at equal intervals along the row direction and the column direction respectively.

In one example, the number of the longitudinal floating field plate structures 104 in each row is equal to the number of columns 104 of the longitudinal floating field plate array, and the number of the longitudinal floating field plate structures 104 in each column is equal to the number of rows of the longitudinal floating field plate array. That is, adjacent floating field plate structures 104 in each row are arranged in a one-to-one correspondence and are not arranged in a staggered manner, and adjacent floating field plate structures 104 in each column are arranged in one-to-one correspondence and are not arranged in a staggered manner as well.

It should be noted that the conductive layer 1042 is configured to penetrate through the drift region 102 of the second conductivity type from the surface of the drift region 102 of the second conductivity type and extend into the substrate 101 of the first conductivity type, so that a surface of an eventually formed device and the substrate 101 of the first conductivity type are equal in potential, thereby improving the stability of the device.

It should be further noted that the term "floating" in the longitudinal floating field plate structure 104 indicates that the longitudinal floating field plate structure 104 is not connected to external voltage.

In one example, the laterally diffused metal oxide semiconductor device further includes: a well region 105 of the first conductivity type, a well region 106 of the second conductivity type, a source region 110, a drain region 111, a body region 109 of the first conductivity type, a field oxide layer 107 and the gate 108. The well region 105 of the first conductivity type is located in the drift region 102 of the second conductivity type and abuts the drift region 102 of the second conductivity type. The well region 106 of the second conductivity type is located in the drift region 102 of the second conductivity type, and is located at a side of the longitudinal floating field plate array away from the well region 105 of the first conductivity type and is spaced apart from the longitudinal floating field plate array. The source region 110 is located in the well region 105 of the first conductivity type and is spaced apart from the drift region 102 of the second conductivity type 102. The drain region 111 is located in the well region 106 of the second conductivity type. The body region 109 of the first conductivity type is located in the well region 105 of the first conductivity type, and is located at a side of the source region 110 away from the longitudinal floating field plate array and is in contact with the source region 110. The field oxide layer 107 is located on the drift region 102 of the second conductivity type and covers the longitudinal floating field plate array. The gate 108 extends from the well region 105 of the first conductivity type to a surface of the field oxide layer 107. The well region 106 of the second conductivity type serves as a buffer of the drift region 111 for a drain region 111, which can increase an on-state breakdown voltage of the LDMOS device during a forward operation. The well region 105 of the first conductivity type serves as a region for forming the conductive channel of the device, and the concentration of the well region 105 of the first conductivity type can affect the depletion and the on-state voltage drop of the drift region 102 of the second conductivity type.

In one example, a depth of the well region 105 of the first conductivity type may be equal to a depth of the drift region 102 of the second conductivity type, and a depth of the well region 106 of the second conductivity type is less than the depth of the drift region 102 of the second conductivity type.

In one example, the gate 108 may include, but is not limited to, a polysilicon gate, and specifically, the gate 108 may include a doped polysilicon gate.

Specifically, the body region 109 is a region of the first conductivity type, the source region 110 is a region of the second conductivity type, and the drain region 111 is a region of the second conductivity type. More specifically, the body region 109, the source region 110 and the drain region 111 are all heavily doped regions. The substrate 101 of the first conductivity type, the drift region 102 of the second conductivity type, the implantation region 103 of the first conductivity type, the well region 105 of the first conductivity type, and the well region 106 of the second conductivity type are all lightly doped regions. The so-called "heavily doped region" refers to a region where the doping concentration is greater than or equal to $1 \times 10^{18}$ atom/cm$^3$, and the so-called "lightly doped region" refers to a region having a doping concentration of less than or equal to $1 \times 10^{18}$ atom/cm$^3$.

In one example, the laterally diffused metal oxide semiconductor device further includes a plurality of conductive equipotential strips 112 disposed on the field oxide layer 107. Each of the plurality of conductive equipotential strips 112 extends along the width direction of the conductive channel and is electrically connected to, via a conductive structure penetrating through the field oxide layer 107, a column of the longitudinal floating field plate structures 104 located below the field oxide layer 107.

In the above example, by setting the plurality of conductive equipotential strips 112, and each of the plurality of conductive equipotential strips 112 being electrically connected to a column of longitudinal floating field plate structures 104 located below the conductive equipotential strip 112, adjacent two conductive equipotential strips 112 may be considered as a pair of parallel plate capacitors with a constant potential difference, thereby the withstand voltage of the device can increase with the increased number of the longitudinal floating field plate structures 104.

In one example, a material of the conductive equipotential strip 112 and the conductive structure 113 may be metal, and specifically, may be aluminum, copper, gold or nickel, etc.

In one example, the plurality of conductive equipotential strips arranged in columns are at equal intervals. That is, the plurality of conductive equipotential strips 112 are at equal intervals in the column direction, so that two adjacent longitudinal floating field plate structures 104 may have equal capacitance.

In one example, the plurality of conductive equipotential strips further constitute equipotential rings defining a racetrack shaped structure by end-to-end. As shown in FIG. 14, the plurality of conductive equipotential strips 112, the plurality of implantation region 103 of the first conductivity type and the plurality of longitudinal floating field plate structures 104 are located in the racetrack shaped region 20.

In one example, as shown in FIG. 15, the plurality of longitudinal floating field plate structures 104 are arranged side by side.

In yet another embodiment, referring to FIG. 16 to FIG. 17 and in combination with FIG. 12 to FIG. 15, the present disclosure further provides a laterally diffused metal oxide semiconductor device. The laterally diffused metal oxide semiconductor device in this embodiment is substantially the same as that as shown in FIG. 12 to FIG. 15 in the above embodiments, and the difference therebetween may lie in that: in the laterally diffused metal oxide semiconductor device as shown in FIG. 12 to FIG. 15, the implantation of ions of the first conductivity type is performed once in the drift region 102 of the second conductivity type, and the depth of the implantation region 103 of the formed first conductivity type is decreased. However, in this embodiment, multiple implantations of ions of the first conductivity type are performed in the drift region 102 of the second conductivity type, to form the plurality of implantation regions 103 of the first conductivity type in the drift region of the second conductivity type, and each of the plurality of implantation regions 103 of the first conductivity type includes a plurality of sub-implantation regions 1031 of the first conductivity type arranged along the depth direction of the drift region 102 of the second conductivity type. In this embodiment, the plurality of sub-implantation regions of the first conductivity type are formed by performing multiple sub-implantation processes, which is beneficial for better depletion of the drift region 102 of the second conductivity type. As compared to the solution as shown in FIG. 1 to FIG. 15, the performance of the device may be further improved.

In one example, a depth of each of the plurality of implantation regions 103 of the first conductivity type may be also less than a depth of the drift region 102 of the second conductivity type.

In one example, the plurality of sub-implantation regions 1031 of the first conductivity type arranged along the depth direction of the drift region 102 of the second conductivity type may be sequentially connected in series, or may be arranged at intervals.

In the above lateral diffusion metal oxide semiconductor devices, in one example, the first conductivity type may be P-type, and the second conductivity type may be N-type. In another example, the first conductivity type may be N-type, and the second conductivity type may be P-type.

It should be noted that, in the above embodiments, the ellipses in FIGS. 4 to 13, 16 and 17 illustrate several omitted implantation regions 103 of the first conductivity type and several omitted longitudinal floating field plate structures 104.

The above embodiments merely indicate several embodiments of the present disclosure, and the description thereof is more specific and detailed, but is not to be construed as limiting the scope of the disclosure. It should be noted that, for a skilled person in the art, several variations and improvements may be made without departing from the concept of the present disclosure, which shall all fall within the protection scope of the present disclosure. Therefore, the protection scope of the present disclosure shall be defined by the appended claims.

What is claimed is:

1. A laterally diffused metal oxide semiconductor device, comprising:
   a substrate of a first conductivity type;
   a drift region of a second conductivity type located in the substrate of the first conductivity type, the first conductivity type being opposite to the second conductivity type;
   a longitudinal floating field plate array comprising a plurality of longitudinal floating field plate structures arranged at intervals in rows and columns, the longitudinal floating field plate array defining a row direction along a length direction of a conductive channel and a column direction along a width direction of the conductive channel; each of the plurality of longitudinal floating field plate structures comprising a dielectric layer disposed on an inner surface of a trench and a conductive layer filling a remaining part of the trench, the trench penetrating through the drift region of the second conductivity type from a surface of the drift region of the second conductivity type and extending into the substrate of the first conductivity type; and
   a plurality of implantation regions of the first conductivity type located in the drift region of the second conductivity type, each of the plurality of implantation regions of the first conductivity type being located between corresponding two adjacent longitudinal floating field plate structures in each row.

2. The laterally diffused metal oxide semiconductor device according to claim 1, wherein a width of each of the plurality of implantation regions of the first conductivity type is less than or equal to a width of each of the plurality of longitudinal floating field plate structures.

3. The laterally diffused metal oxide semiconductor device according to claim 1, wherein in the longitudinal floating field plate array, the plurality of longitudinal floating field plate structures are arranged at equal intervals along the row direction and the column direction respectively.

4. The laterally diffused metal oxide semiconductor device according to claim 1, wherein a depth of each of the plurality of implantation regions of the first conductivity type is less than a depth of the drift region of the second conductivity type.

5. The laterally diffused metal oxide semiconductor device according to claim 1, wherein each of the plurality of implantation regions of the first conductivity type comprises a plurality of sub-implantation regions of the first conductivity type arranged along a depth direction of the drift region of the second conductivity type.

6. The laterally diffused metal oxide semiconductor device according to claim 1, wherein the plurality of implantation regions of the first conductivity type are configured as one of the following:
   (i) the plurality of implantation regions of the first conductivity type are located in an upper portion of the drift region of the second conductivity type, and a top of each of the plurality of implantation regions of the first conductivity type is flush with an upper surface of the drift region of the second conductivity type or is spaced apart from the upper surface of the drift region of the second conductivity type;
   (ii) the plurality of implantation regions of the first conductivity type are located in a middle portion of the drift region of the second conductivity type; and,
   (iii) the plurality of implantation regions of the first conductivity type are located in a lower portion of the drift region of the second conductivity type, and a bottom of each of the plurality of implantation regions of the first conductivity type is spaced apart from a lower surface of the drift region of the second conductivity type.

7. The lateral diffusion metal oxide semiconductor device according to claim 1, wherein the number of the longitudinal floating field plate structures in each row is equal to the number of columns of the longitudinal floating field plate array, and the number of the longitudinal floating field plate structures in each column is equal to the number of rows of the longitudinal floating field plate array.

8. The laterally diffused metal oxide semiconductor device of claim 1, further comprising:
   a well region of the first conductivity type located in the substrate of the first conductivity type and abutting the drift region of the second conductivity type;
   a well region of the second conductivity type located in the drift region of the second conductivity type, located at a side of the longitudinal floating field plate array away from the well region of the first conductivity type and being spaced apart from the longitudinal floating field plate array;
   a source region located in the well region of the first conductivity type and being spaced apart from the drift region of the second conductivity type;
   a drain region located in the well region of the second conductivity type;
   a body region of the first conductivity type located in the well region of the first conductivity type, located at a side of the source region away from the longitudinal floating field plate array and being in contact with the source region;
   a field oxide layer located on the drift region of the second conductivity type and covering the longitudinal floating field plate array; and
   a gate disposed across the source region and the well region of the first conductivity type well region and extending to a surface of the field oxide layer.

9. The laterally diffused metal oxide semiconductor device according to claim 8, further comprising a plurality of conductive equipotential strips disposed on the field oxide layer; each of the plurality of conductive equipotential strips extending along the width direction of the conductive channel and being electrically connected to a column of the longitudinal floating field plate structures correspondingly located below via a conductive structure penetrating through the field oxide layer.

10. The laterally diffused metal oxide semiconductor device according to claim 9, wherein the plurality of conductive equipotential strips constitute equipotential rings defining a racetrack shaped structure in a layout.

11. The laterally diffused metal oxide semiconductor device according to claim 9, wherein the plurality of conductive equipotential strips arranged in columns are at equal intervals.

12. A method for preparing a laterally diffused metal oxide semiconductor device, comprising following steps:
   providing a substrate of a first conductivity type;
   forming a drift region of a second conductivity type in the substrate of the first conductivity type;
   forming a plurality of implantation regions of the first conductivity type in the drift region of the second conductivity type;
   forming a longitudinal floating field plate array in the drift region of the second conductivity type, the longitudinal floating field plate array comprising a plurality of longitudinal floating field plate structures arranged at intervals in rows and columns, each of the plurality of longitudinal floating field plate structures comprising a dielectric layer disposed on an inner surface of a trench and a conductive layer filling a remaining part of the trench; the trench penetrating through the drift region of the second conductivity type from a surface of the drift region of the second conductivity type and extending into the substrate of the first conductivity type; each of the plurality of the implantation regions of the first conductivity type being located between corresponding two adjacent longitudinal floating field plate structures in each row.

13. The method for preparing the laterally diffused metal oxide semiconductor device according to claim 12, wherein the step of forming the plurality of implantation regions of the first conductivity type in the drift region of the second conductivity type comprises a following step:

performing implantation of ions of the first conductivity type in the drift region of the second conductivity type once to form the plurality of implantation regions of the first conductivity type in the drift region of the second conductivity type; wherein the plurality of implantation regions of the first conductivity type are configured as one of the following:
(i) the plurality of implantation regions of the first conductivity type are located in an upper portion of the drift region of the second conductivity type, and a top of each of the plurality of implantation regions of the first conductivity type is flush with an upper surface of the drift region of the second conductivity type or is spaced apart from the upper surface of the drift region of the second conductivity type;
(ii) the plurality of implantation regions of the first conductivity type are located in a middle portion of the drift region of the second conductivity type; and,
(iii) the plurality of implantation regions of the first conductivity type are located in a lower portion of the drift region of the second conductivity type, and a bottom of each of the plurality of implantation regions of the first conductivity type is spaced apart from a lower surface of the drift region of the second conductivity type.

14. The method for preparing the laterally diffused metal oxide semiconductor device according to claim 12, wherein the step of forming the plurality of implantation regions of the first conductivity type in the drift region of the second conductivity type comprises a following step:

performing multiple implantations of ions of the first conductivity type in the drift region of the second conductivity type, to form the plurality of implantation regions of the first conductivity type in the drift region of the second conductivity type, each of the plurality of implantation regions of the first conductivity type comprising a plurality of sub-implantation regions of the first conductivity type arranged along a depth direction of the drift region of the second conductivity type; wherein the plurality of implantation regions of the first conductivity type are configured as one of the following:
(i) the plurality of implantation regions of the first conductivity type are located in an upper portion of the drift region of the second conductivity type, and a top of each of the plurality of implantation regions of the first conductivity type is flush with an upper surface of the drift region of the second conductivity type or is spaced apart from the upper surface of the drift region of the second conductivity type;
(ii) the plurality of implantation regions of the first conductivity type are located in a middle portion of the drift region of the second conductivity type; and,
(iii) the plurality of implantation regions of the first conductivity type are located in a lower portion of the drift region of the second conductivity type, and a bottom of each of the plurality of implantation regions of the first conductivity type is spaced apart from a lower surface of the drift region of the second conductivity type.

15. The method for preparing the laterally diffused metal oxide semiconductor device according to claim 12, wherein after the step of forming the longitudinal floating field plate array in the drift region of the second conductivity type, the method further comprises:

forming a well region of the first conductivity type at a side of the drift region of the second conductivity type;
forming a well region of the second conductivity type in the drift region of the second conductivity type, the well region of the second conductivity type being located in the drift region of the second conductivity type at a side of the longitudinal floating field plate array away from the well region of the first conductivity type and being spaced apart from the longitudinal floating field plate array;
forming a field oxide layer on the drift region of the second conductivity type, the field oxide layer covering the longitudinal floating field plate array;
forming a gate on the well region of the first conductivity type and the field oxide layer, the gate extending from the well region of the first conductivity type to a surface of the field oxide layer;
forming a source region as well as a body region of the first conductivity type in the well region of the first conductivity type, forming a drain region in the well region of the second conductivity type, the source region being spaced apart from the drift region of the second conductivity type, the body region of the first conductivity type being located at a side of the source region away from the longitudinal floating field plate array and being in contact with the source region;
forming a plurality of interconnection holes in the field oxide layer, the plurality of interconnection holes being in one-to-one correspondence with the plurality of longitudinal floating field plate structures and exposing the conductive layer of each of the plurality of longitudinal floating field plate structures;
forming a conductive structure in each of the plurality of interconnection holes; and
forming a plurality of conductive equipotential strips on the field oxide layer, each of the plurality of conductive equipotential strips extending along a width direction of the conductive channel and being electrically connected to a column of the longitudinal floating field plate structures correspondingly located below via the conductive structure.

16. The laterally diffused metal oxide semiconductor device according to claim 1, wherein the dielectric layer is selected from an oxide layer, a nitride layer and a nitrogen oxide layer;
the conductive layer is a doped polysilicon layer.

17. The laterally diffused metal oxide semiconductor device according to claim 1, wherein the first conductivity type and the second conductivity type are configured as one of the following:
(i) the first conductivity type is P-type, and the second conductivity type is N-type; and (ii) the first conductivity type is N-type, and the second conductivity type is P-type.

18. The method for preparing the laterally diffused metal oxide semiconductor device according to claim 12, wherein the step of forming the plurality of implantation regions of the first conductivity type in the drift region of the second conductivity type comprises following steps:
   forming a patterned mask layer on a surface of the drift region of the second conductivity type, the patterned mask layer having an opening pattern exposing the drift region of the second conductivity type and defining a shape and position of each of the plurality of implantation regions of the first conductivity type;
   performing at least one ion implantation in the drift region of the second conductivity type by using the patterned mask layer, and performing a high temperature junction-pushing process to form the plurality of implantation regions of the first conductivity type; and
   removing the patterned mask layer.

19. The method for preparing the laterally diffused metal oxide semiconductor device according to claim 12, the step of forming the longitudinal floating field plate array in the drift region of the second conductivity type comprises following steps:
   forming a plurality of trenches arranged at intervals in multiple rows and columns are formed in the drift region of the second conductivity type, a row direction of the plurality of trenches being a length direction of a subsequently formed conductive channel, and a column direction of the plurality of trenches being a width direction of the subsequently formed conductive channel; each of the plurality of trenches penetrating through the drift region of the second conductivity type from a surface of the drift region of the second conductivity type, and extending into the substrate of the first conductivity type;
   forming the dielectric layer on an inner surface of each of the plurality of trenches; and
   forming the conductive layer on a surface of the dielectric layer and filling a remaining part of each of the plurality of trenches.

20. The method for preparing the laterally diffused metal oxide semiconductor device according to claim 19, wherein the step of forming the plurality of trenches arranged at intervals in multiple rows and columns are formed in the drift region of the second conductivity type comprises: forming the plurality of trenches by using a photolithography process and an etching process; wherein the step of forming the dielectric layer on the inner surface of each of the plurality of trenches comprises: forming the dielectric layer by using one of a thermal oxidation process, a physical vapor deposition process, a chemical vapor deposition process, and an atomic layer deposition process; and wherein the step of forming the conductive layer on a surface of the dielectric layer and filling the remaining part of each of the plurality of trenches comprises: forming the conductive layer by using one of a physical vapor deposition process, a chemical vapor deposition process, and an atomic layer deposition process.

* * * * *